United States Patent
Eken et al.

(10) Patent No.: US 10,852,437 B2
(45) Date of Patent: *Dec. 1, 2020

(54) HIGH DYNAMIC RANGE ANALOG FRONT-END RECEIVER FOR LONG RANGE LIDAR

(71) Applicant: Analog Devices Global Unlimited Company, Hamilton (BM)

(72) Inventors: Yalcin Alper Eken, Istanbul (TR); Alp Oguz, Beyoglu (TR)

(73) Assignee: ANALOG DEVICES GLOBAL UNLIMITED COMPANY, Hamilton (BM)

(*) Notice: Subject to any disclaimer, the term of this patent is extended or adjusted under 35 U.S.C. 154(b) by 75 days.

This patent is subject to a terminal disclaimer.

(21) Appl. No.: 16/442,173

(22) Filed: Jun. 14, 2019

(65) Prior Publication Data

US 2019/0293799 A1  Sep. 26, 2019

Related U.S. Application Data

(63) Continuation of application No. 15/698,491, filed on Sep. 7, 2017, now Pat. No. 10,338,224.

(Continued)

(51) Int. Cl.
*H03F 3/08* (2006.01)
*G01S 17/93* (2020.01)
(Continued)

(52) U.S. Cl.
CPC .............. *G01S 17/93* (2013.01); *G01S 7/483* (2013.01); *G01S 7/4861* (2013.01);
(Continued)

(58) Field of Classification Search
CPC ........................................................ H03F 3/08
(Continued)

(56) References Cited

U.S. PATENT DOCUMENTS

| 4,415,803 A | 11/1983 | Muoi |
| 4,740,686 A | 4/1988 | Nusser |

(Continued)

FOREIGN PATENT DOCUMENTS

| JP | H09-172329 | 6/1997 |
| JP | 2006-005761 | 1/2006 |

(Continued)

OTHER PUBLICATIONS

Notice of Allowance mailed in U.S. Appl. No. 15/698,491 dated Jul. 16, 2018.

(Continued)

*Primary Examiner* — Henry Choe
(74) *Attorney, Agent, or Firm* — Patent Capital Group

(57) ABSTRACT

A system and method for operating a high dynamic range analog front-end receiver for long range LIDAR with a transimpedance amplifier (TIA) include a clipping circuit to prevent saturation of the TIA. The output of the clipping circuit is connected via a diode or transistor to the input of the TIA and regulated such that the input voltage of the TIA remains close to or is only slightly above the saturation threshold voltage of the TIA. The regulation of the input voltage of the TIA can be improved by connecting a limiting resistor in series with the diode or transistor. A second clipping circuit capable of dissipating higher input currents and thus higher voltages may be connected in parallel with the first clipping circuit. A resistive element may be placed between the first and second clipping circuits to further limit the input current to the TIA.

29 Claims, 9 Drawing Sheets

Related U.S. Application Data

(60) Provisional application No. 62/483,315, filed on Apr. 7, 2017, provisional application No. 62/477,053, filed on Mar. 27, 2017.

(51) Int. Cl.
| | |
|---|---|
| *H03F 1/08* | (2006.01) |
| *H03F 1/32* | (2006.01) |
| *G01S 7/483* | (2006.01) |
| *H03F 1/26* | (2006.01) |
| *H03F 3/45* | (2006.01) |
| *H04B 10/69* | (2013.01) |
| *G01S 7/4861* | (2020.01) |
| *G01S 7/486* | (2020.01) |

(52) U.S. Cl.
CPC .............. *G01S 7/4868* (2013.01); *H03F 1/08* (2013.01); *H03F 1/26* (2013.01); *H03F 1/32* (2013.01); *H03F 3/08* (2013.01); *H03F 3/45475* (2013.01); *H04B 10/693* (2013.01); *H03F 2200/66* (2013.01)

(58) Field of Classification Search
USPC .......................................................... 330/308
See application file for complete search history.

(56) References Cited

U.S. PATENT DOCUMENTS

| | | | |
|---|---|---|---|
| 5,123,732 | A | 6/1992 | Gross et al. |
| 5,410,282 | A | 4/1995 | Larrick et al. |
| 5,532,471 | A | 7/1996 | Khorramabadi et al. |
| 5,793,230 | A | 8/1998 | Chu et al. |
| 6,404,281 | B1 | 6/2002 | Kobayashi |
| 6,816,009 | B2 | 11/2004 | Hughes et al. |
| 7,183,859 | B2 | 2/2007 | Visocchi et al. |
| 8,896,950 | B1 | 11/2014 | Polley et al. |
| 8,896,976 | B2 | 11/2014 | Park |
| 9,246,023 | B2 | 1/2016 | Laforce |
| 9,325,426 | B2 | 4/2016 | Swoboda |
| 9,450,542 | B2 | 9/2016 | Mita et al. |
| 9,496,826 | B2 | 11/2016 | Sugimoto |
| 9,954,622 | B2 * | 4/2018 | Sugimoto ............. H03F 1/0233 |
| 9,966,907 | B1 | 5/2018 | Bafar et al. |
| 2004/0016867 | A1 | 1/2004 | Milshtein et al. |
| 2006/0034621 | A1 | 2/2006 | Denoyer |
| 2007/0152136 | A1 | 7/2007 | Yao et al. |
| 2009/0135714 | A1 | 5/2009 | Deliwala |
| 2010/0283542 | A1 | 11/2010 | Shivaram et al. |
| 2012/0021712 | A1 | 1/2012 | Mikhemar et al. |
| 2014/0001341 | A1 | 1/2014 | Hassibi et al. |
| 2018/0275250 | A1 | 9/2018 | Adut |
| 2018/0275280 | A1 | 9/2018 | Eken et al. |
| 2018/0284272 | A1 | 10/2018 | Adut |

FOREIGN PATENT DOCUMENTS

| | | |
|---|---|---|
| JP | 2007-174440 | 7/2007 |
| JP | 2008-507943 | 8/2008 |
| JP | 2015-186013 | 3/2014 |
| JP | 2014-62767 | 4/2014 |
| JP | 2014-142340 | 8/2014 |
| JP | 2014-192898 | 10/2014 |

OTHER PUBLICATIONS

Non-Final Office Action issued in U.S. Appl. No. 15/698,471 dated Oct. 19, 2018, 8 pages.
Non-Final Office Action issued in U.S. Appl. No. 15/698,471 dated Feb. 13, 2019, 7 pages.
Notice of Allowance mailed in U.S. Appl. No. 15/698,491 dated Apr. 10, 2019, 6 pages.
Mikko Hintikka et al., A CMOS Laser Radar Receiver for Sub-ns Optical Pulses, 978-1-4799-8229-5/151 © 2015 IEEE, 4 pages.
Sami Kurtti et al., CMOS Receiver for a Pulsed TOF Laser Rangefinder Utilizing the Time Domain Walk Compensation Scheme, 20th IMEKO TC4 International Symposium and 18th International Workshop on ADC Modelling and Testing Research on Electric and Electronic Measurement for the Electronic Upturn, Benevento, Italy, Sep. 15-17, 2014, 5 pages.
Kurtti et al. *An Integrated Receiver Channel for a Laser Scanner*, IEEE Instrumentation and Measurement Technology Conference, May 2012.
Thakur et al., Efficient Design of 64:1 Hybridized MUX for Low Area and Power VLSI, Int. Journal of Electrical & Electronics Engg., vol. 2, Issue 1 (2015), e-ISSN: 1694-2310 / p-ISSN: 1694-2426, 3 pages.
Analog Switch and Multiplexer Applications, Application Note, AN1034, Aug. 2002, Intersil®, 3 pages.
MAX3806, Receiver for Optical Distance Measurement, Maxim Integrated, Rev. 1; Jun. 2014, 10 pages.
Matrix APD Detector Arrays for LIDAR, Silicon Sensor International AG, Pacific Silicon Sensor, Inc., press release dated Nov. 9, 2010, 2 pages.
Heinrichs et al., Three-Dimensional Laser Radar with APD Arrays, Proceedings vol. 4377, Laser Radar Technology and Applications VI; Sep. 19, 2001, 12 pages.
Choosing the Correct Switch, Multiplexer, or Protection Product for Your Application, © 2011 Analog Devices, Inc. www.analog.com/switch-mux, 8 pages.
Robinson et al., 64×64-Element Photocurrent Multiplexer for Infrared Staring Array Application, IEEE Journal of Solid-State Circuits, vol. SC-22, No. 3, Jun. 1987, 0018-9200/87/0600-0453 © 1987 IEEE, 5 pages.
First Sensor Application Note; APD Array with Guard Ring, First Sensor, First Sensor AG, Pacific First Sensor, Inc., Ver. Aug. 7, 2011, 2 pages.
ADS7952 Input Multiplexer / Photodiode / Transimpendanceamplifier, Mar. 2, 2018, http://e2e.ti.com/support/data_converters/precision_data_converters/f/73/t/74981, 6 pages.
Avalanche Photodiodes for LIDAR Applications, First Sensor, Mar. 3, 2014, First Sensor, First Sensor AG, First Sensor, Inc., 2 pages.
High-Speed, Low-Power, Single-Supply Multichannel, Video Multiplexer-Amplifiers, Maxim, MAX4310-MAX4315, 19-1379; Rev. 3; Mar. 2008, 18 pages.
11.3 Gbps Optical Receiver, ADN3010-11 Data Sheet, Analog Devices, © 2015-2016 Analog Devices, Inc., 11 pages.
LTC6560 Single Channel Transimpedance Amplifier with Output Multiplexing, DICE/DWF Specification, © 2019 Analog Devices, Inc. 4 pages.
LTC6561 Four-Channel Multiplexed Transimpedance Amplifier with Output Multiplexing, © 2018 Analog Devices, Inc., 24 pages.
LTC6561 DICE/DWF, Four-Channel Multiplexed Transimpedance Amplifier with Output Multiplexing, (c) 2019 Analog Devices, Inc. 4 pages.
Hamburger et al., Transimpedance Amplifier with Fast Overload Recovery Targets Lidar Automotive Markets, Press Release, Nov. 20, 2018, Norwood, MA, 3 pages.
JP Office Action dated Jul. 8, 2019 in JP2018-58185.
EN Translation of JP Office Action dated Jul. 8, 2019 in JP2018-58185.
EN Abstract of JP2007-174440.
EN Abstract of JP2014-062767.
EN Translation (Patent Translate) of Bibliographic Data, Description and Claims of JP2014142340A, 13 pages.
EN Translation of Bibliographic Data of JP2006005761A, 13 page.

* cited by examiner

HIGH DYNAMIC RANGE ANALOG FRONT-END RECEIVER FOR LONG RANGE LIDAR

RELATED APPLICATIONS

This application claims the benefit of U.S. Provisional Application Ser. No. 62/477,053 filed on Mar. 27, 2017, and of U.S. Provisional Application Ser. No. 62/483,315 filed on Apr. 7, 2017 and U.S. patent application Ser. No. 15/698,491 filed on Sep. 7, 2017. The US Provisional and Non-Provisional Applications are hereby incorporated by reference in their entirety.

FIELD OF THE DISCLOSURE

The present disclosure relates to the field of remote sensing that uses light from a pulsed light source to measure ranges or distances from objects. More particularly, the present disclosure relates to shunt-feedback transimpedance amplifiers of the type used in remote sensing applications.

BACKGROUND

Remote sensing using light pulses emitted for example by lasers and retroreflected by distant objects is sometimes also referred to as LIDAR (light detection and ranging). A LIDAR receiver, hereinafter also referred to as a front-end receiver, includes an optical receiver having a photodiode (PD) or an avalanche photodiode (APD) as a receiving element, and a transimpedance amplifier (TIA), for example a shunt-feedback amplifier, which converts the photocurrent from the receiving photodiode into a voltage.

In the following, the terms photodiode (PD) and avalanche photodiode (APD) will be used interchangeably, unless otherwise stated. A photodiode is typically a p-n junction or PIN structure. When a photon of sufficient energy strikes the diode, it creates an electron-hole pair. This mechanism is also known as the inner photoelectric effect. If the absorption occurs in the junction's depletion region, or one diffusion length away from it, these carriers are swept from the junction by the built-in electric field of the depletion region. Thus holes move toward the anode, and electrons toward the cathode, and a photocurrent is produced. When used in zero bias or photovoltaic mode, the flow of photocurrent out of the device is restricted and a voltage builds up. When used in photoconductive mode, the diode is often reverse-biased (with the cathode driven positive with respect to the anode). This reduces the response time because the additional reverse bias increases the width of the depletion layer, which decreases the junction's capacitance. The reverse bias also increases the dark current without much change in the photocurrent. For a given spectral distribution, the photocurrent is linearly proportional to the illuminance (and to the irradiance).

APDs can be thought of as photodetectors that provide a built-in first stage of gain through avalanche multiplication. From a functional standpoint, they can be regarded as the semiconductor equivalent to photomultipliers. Due to their high sensitivity, a typical application for APD's is in laser rangefinders and long range fiber-optic telecommunication.

In some applications, an APD generates a current pulse proportional to the received electromagnetic power and a TIA converts the current pulse into a voltage pulse and also provides a high gain in order to detect weaker signals from distant objects. For closer objects, the magnitude of the current pulse at the input of the TIA can reach the limits of linear operation of the TIA. In such cases, the TIA becomes saturated. In shunt-feedback amplifier topology, saturation causes the output voltage pulse to widen by a certain amount, which is referred to as pulse-width distortion. Upon overloading, such transimpedance amplifiers have very long relaxation times until again the TIA can return to linear operation.

SUMMARY OF THE DISCLOSURE

A system and method for operating a high dynamic range analog front-end receiver for long range LIDAR with a transimpedance amplifier (TIA) include a clipping circuit to prevent saturation of the TIA. The output of the clipping circuit is connected via a diode or transistor to the input of the TIA and regulated such that the input voltage of the TIA remains close to or is only slightly above the saturation threshold voltage of the TIA. The regulation of the input voltage of the TIA can be improved by connecting a limiting resistor in series with the diode or transistor. A second clipping circuit capable of dissipating higher input currents and thus higher voltages may be connected in parallel with the first clipping circuit. A resistive element may be placed between the first and second clipping circuits to further limit the input current to the TIA.

It would be beneficial to provide a front-end receiver with a transimpedance amplifier (TIA), which enables detection of the photocurrent from the receiving photodiode or APD with no or only minimal pulse-width distortion caused by large photocurrents. A system and method for adaptive clipping an input voltage of a transimpedance amplifier (TIA) so as to prevent the TIA from going too deep into saturation include a first adaptive clipping circuit receiving a feedback voltage from an input of the TIA and a clip voltage. The output of the first adaptive clipping circuit is connected by way of a diode or transistor to the input of the TIA and regulated such that the input voltage of the saturated TIA is kept as close as possible to the saturation threshold voltage of the TIA and never exceeds the saturation voltage of the TIA by more than a turn-on voltage of the diode or transistor, preferably by no more than half the turn-on voltage of the diode or transistor. The regulation of the input voltage of the TIA can be improved by connecting a limiting resistor in series with the diode or transistor. A second clipping circuit capable of dissipating higher input currents and thus higher voltages than the first adaptive clipping circuit may be connected in parallel with the first adaptive clipping circuit.

In certain embodiments, a front-end receiver is provided that includes a transimpedance amplifier (TIA) configured to convert an input current applied to an input port into an output voltage, and a first adaptive clipping circuit, coupled to the input port by way of a diode path and configured to, in response to a clip voltage applied to the first adaptive clipping circuit, limiting a maximum value of an input voltage of the TIA to an externally applied clip voltage so that the TIA is not overly saturated. In some cases, the first adaptive clipping circuit can limit the maximum value of the input voltage of the TIA such that the TIA operates as close as possible to the saturation threshold voltage of the TIA.

In certain embodiments, a method is provided for operating a transimpedance amplifier (TIA) of a front-end receiver so that the TIA is not overly saturated or operating the TIA as close as possible to the saturation threshold voltage of the TIA, wherein the method includes supplying to a first adaptive clipping circuit at a first input terminal a clip voltage selected to be approximately equal to a saturation threshold voltage of the TIA, supplying to the first adaptive clipping circuit at a second input terminal a feedback voltage derived from an input voltage of the TIA, coupling an output voltage of the first adaptive clipping circuit to an input port of the TIA by way of a diode path comprising a rectifying element having a turn-on voltage; and regulating an output voltage of the first adaptive clipping circuit such that the feedback voltage is equal to the clip voltage. In this way, a maximum value of the input voltage of the TIA is limited to a value that is higher than a saturation threshold voltage of the TIA by no more than the turn-on voltage of the rectifying element, preferably half the turn-on voltage of the rectifying element, to ensure that the TIA is not overly saturated.

BRIEF DESCRIPTION OF THE DRAWINGS

To provide a more complete understanding of the present disclosure and features and advantages thereof, reference is made to the following description, taken in conjunction with the accompanying figures, wherein like reference symbols represent like parts, in which.

DETAILED DESCRIPTION

The pulsed time-of-flight (TOF) laser ranging method is based on the measurement of a transit time ($\Delta T$) of a short laser pulse (width for example about 3 ns) to an optically visible target and back to the front-end receiver. The measured transit time can be converted to a distance (R) between the target and the receiver.

LIDAR based on pulsed TOF measurements is particularly appealing in environmental perception systems where a high measurement speed (>1000 results/s) is needed, where the dynamics of the received echo can be very wide (>1:1000) and where an accurate distance measurement (<1 cm) is needed even with a single transmitted pulse to distances of up to tens of meters to non-cooperative targets. Examples of this kind are anti-collision systems and scanners in traffic applications. For example, in automotive applications the dynamic range may exceed 1:100,000. In the case of a mirror-like reflection or a reflection from a close object, a very high input signal may appear at the input of the receiver channel. The input signal may approach 10-100 mA or even 0.5-1 A, which may saturate the receiver channel.

Of interest is also a measurement of the pulse-width of the received pulses in LIDAR applications, since the pulse-width difference between the transmitted and the received pulses in LIDAR applications also carries information about the weather (moisture, fog, etc.). The pulse-width can increase, for example, due to multiple scattering events under foggy conditions, thus distinguishing this pulse-widening from the TIA's own pulse-widening is valuable. Limiting the pulse-width also enables increasing the number of pulses in a pulse train in a given time period; which is helpful when using averaging techniques to improve SNR.

Accordingly, it is advantageous and in many situations essential to prevent deep saturation of a TIA caused by large currents that induce a voltage highly exceeding the saturation threshold voltage of the TIA, and to keep both the amount and the variation of pulse-width distortion small over a wide range of input current amplitudes.

Figure 1A:
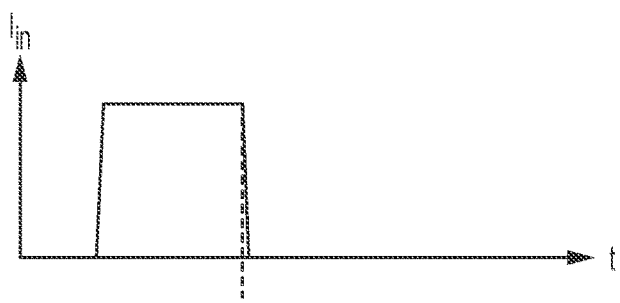
FIGS. 1A-C shows a schematic diagram of pulse-widening due to oversaturation of a transimpedance amplifier (TIA), according to some embodiments of the disclosure.
Figure 1B:
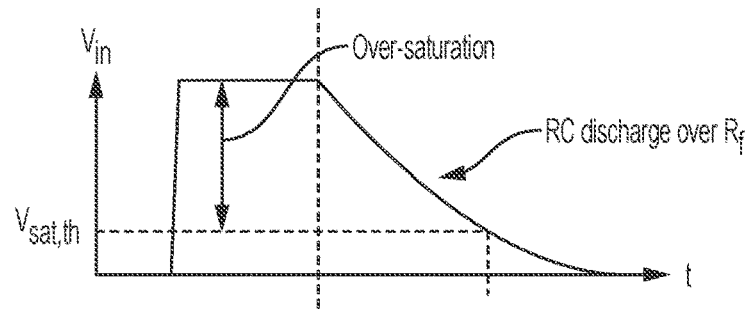
Figure 1C:
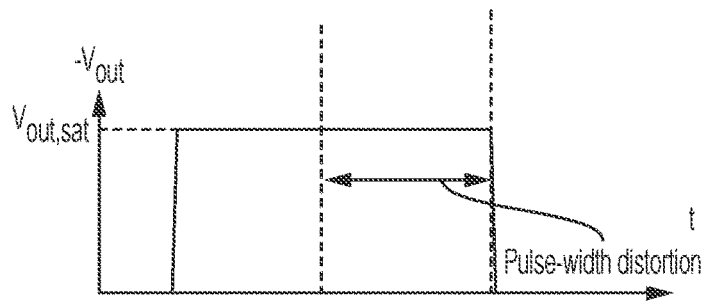

FIG. 1A shows an exemplary current pulse of photocurrent $I_{in}$ generated in response to a laser pulse. The photocurrent pulse $I_{in}$ produces an input voltage $V_{in}$ at the input of the TIA which would mirror the shape of the input current if the TIA were to operate in its linear operating range. However, the TIA is characterized by an input saturation voltage threshold $V_{sat,th}$ above which the TIA becomes saturated. With increasing photocurrent $I_{in}$, the TIA input voltage $V_{in}$ enters an "oversaturation" region, from where it decays at the end of the pulse with a time constant determined by the resistor-capacitor (RC) discharge over the feedback resistor $R_f$. The value of the capacitance C is determined by, for example, the capacitance to the APD and other parasitic capacitances of the system. As evident from FIG. 1B, the width of the pulse is substantially broadened before the input voltage $V_{in}$ of the TIA returns to the linear operating region (<$V_{sat,th}$). This increases the detected pulse-width of the output voltage $V_{out,sat}$ by an amount indicated in FIG. 1C as "Pulse-width distortion", which therefore does no longer resemble the shape of the received photocurrent pulse $I_{in}$ in FIG. 1A. It would therefore be desirable to limit the input voltage $V_{in}$ at the input of the TIA to a value that is close to the input saturation voltage threshold $V_{sat,th}$.

Figure 2:
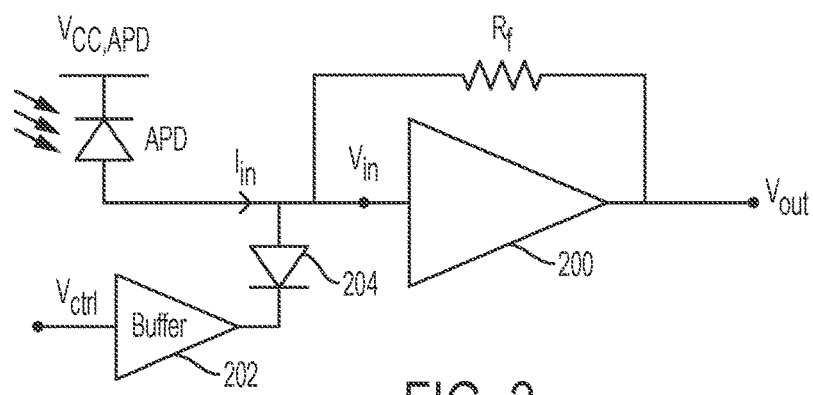
FIG. 2 shows a TIA with a clipping circuit controlled by an external control voltage, according to some embodiments of the disclosure.

According to some embodiments of the disclosure, a schematic circuit diagram illustrated in FIG. 2 shows a transimpedance amplifier (TIA) 200 receiving at an input an input voltage $V_{in}$ generated by a photocurrent $I_{in}$ from an avalanche photodiode (APD) in response to a received light input signal from an unillustrated light source, for example a laser. The DC and low-frequency gain of a transimpedance amplifier can be determined by the equations (1) and (2), in cases where the gain of the amplifier is sufficiently large:

$$-I_{in} = \frac{V_{out}}{R_f} \qquad (eq.\ 1)$$

so that the gain is $$\frac{V_{out}}{I_{in}} = -R_f. \qquad (eq.\ 2)$$

The high gain of the op-amp of the TIA keeps the photodiode current equal to the feedback current through resistor $R_f$.

According to some embodiments of the disclosure, pulse-width distortion or pulse-widening may be reduced by limiting (clipping) the TIA input voltage $V_{in}$ with a diode, wherein the clipping path is inactive during linear operation below the saturation voltage $V_{sat,th}$, without significantly increasing noise. For example, the input voltage $V_{in}$ of a TIA may be limited by bridging the input of the TIA with Schottky or Zener diodes (not shown). Disadvantageously, however, due to current leakage even when these diodes operate below their turn-on voltage (which is approximately 0.7 for Si junctions and approximately 0.3 V for Ge junctions), the clip voltage cannot be selected to be very close to the saturation threshold $V_{sat,th}$.

The forward current through a diode is given by the following equation $$I_D = I_S\left(e^{\frac{V_D q}{kT}} - 1\right) \qquad (eq.\ 3)$$

wherein
$V_D$=is the applied voltage across the diode
k=is the Boltzman constant (1.38*10$^{-23}$ Joules/Kelvin)
T=is the absolute temperature in Kelvin
q=is the electron charge (1.6*10$^{19}$ Coulomb)
$I_D$=is the actual current through the diode
$I_S$=is the diffusion current (a device dependent constant).

The so called thermal diode voltage, $V_T$, is kT/q=26 mV at room temperature.

It is evident from (eq. 3) that $I_D$ increases exponentially with $V_D$ and is non-zero even below the bandgap of approximately 0.7 V for a Si diode. Depending on the specific application, the forward leakage current through diode 204 in FIG. 2 may be considered as being negligible when the forward bias across diode 204 is reduced from the bandgap (or theoretical turn-on voltage) of the diode by a multiple of the thermal voltage $V_T$, for example by approximately eight times the thermal voltage $V_T$, i.e. by approximately 8*26 mV or approximately 200 mV.

According to some embodiments of the disclosure, as illustrated in FIG. 2, the clip voltage may be adjusted by connecting an output of a buffer amplifier 202 which has a first input controlled by an external control voltage $V_{ctrl}$ to a reverse-biased diode 204 which is in turn connected to the input of the TIA. A second (unillustrated) input may be connected to a common mode voltage, for example to ground. The buffer amplifier may be implemented as a voltage follower. The diode may be, for example, a Si diode with a turn-on voltage of approximately 0.7 V. In order to clip the input voltage $V_{in}$ at a value of, for example, $\Delta V=350$ mV above an exemplary saturation threshold $V_{sat,th}$ of 2 V, the control voltage $V_{ctrl}$ would have to be 1.85 V. During linear operation of the TIA, when the input voltage $V_{in}$ of the TIA is below the saturation threshold $V_{sat,th}$ of 2 V, the diode 204 in FIG. 2 is essentially non-conducting because the voltage on the diode is 0.25V and the input voltage $V_{in}$ is determined solely by the feedback resistor $R_f$. When $V_{in}$ exceeds 2.35 V, the diode becomes forward-biased and excess current $I_{in}$ will be dissipated by diode 204. It should be noted that the value of $\Delta V=350$ mV is merely chosen as a representative example and may be, for example, equal to approximately the turn-on voltage of the diode (0.7 V for a Si diode and 0.3 V for a Ge diode), preferably one-half of the turn-on voltage of the diode, or a multiple of the thermal voltage $V_T$ of the diode, for example 200 mV which is approximately eight times $V_T$, as long as $V_{in}$ is still within the normal operating range of the TIA.

Because the diode 204 must be able to dissipate relatively large currents above the saturation threshold $V_{sat,th}$ without causing an excessive increase in $V_{in}$, the forward resistance of diode must be small, which would require a large diode. However, larger diodes have also a significantly larger capacitance than smaller diodes which would in turn increase the RC time constant that controls the RC discharge time in FIG. 1B, decrease the bandwidth and increase TIA noise.

Figure 3A:
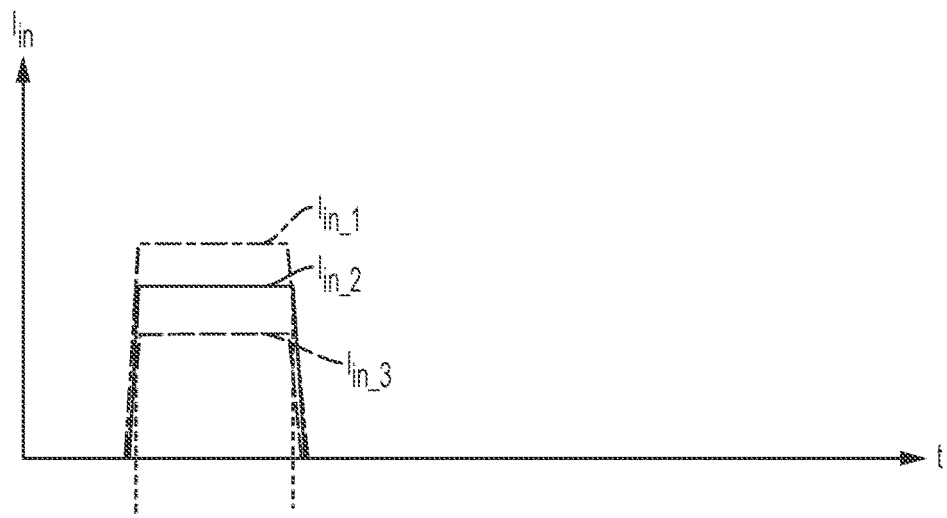
FIGS. 3A-3C show the effect of clipping with the clipping circuit of FIG. 2 on the input voltage and the output voltage of the TIA, according to some embodiments of the disclosure.
Figure 3B:
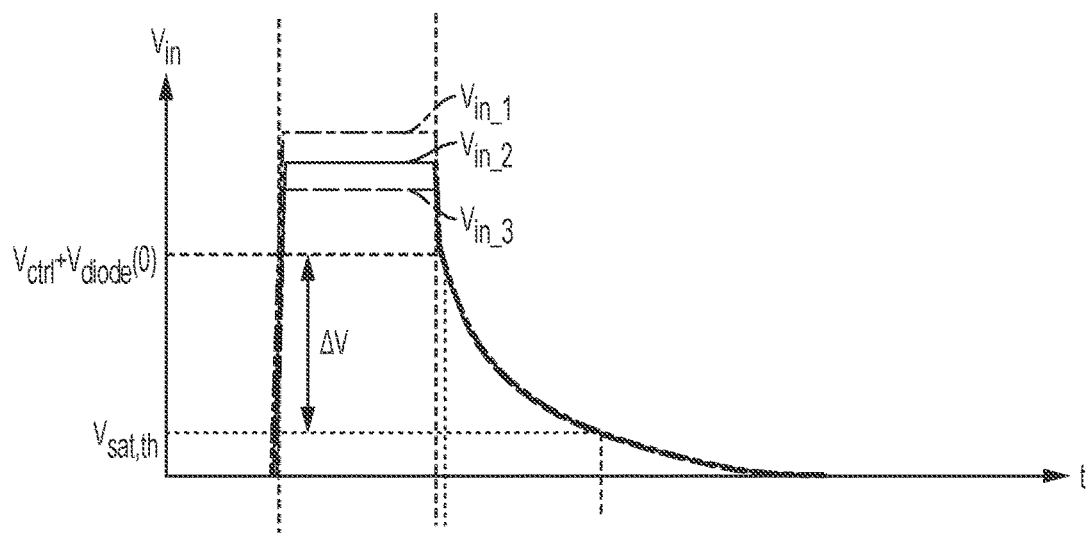
Figure 3C:
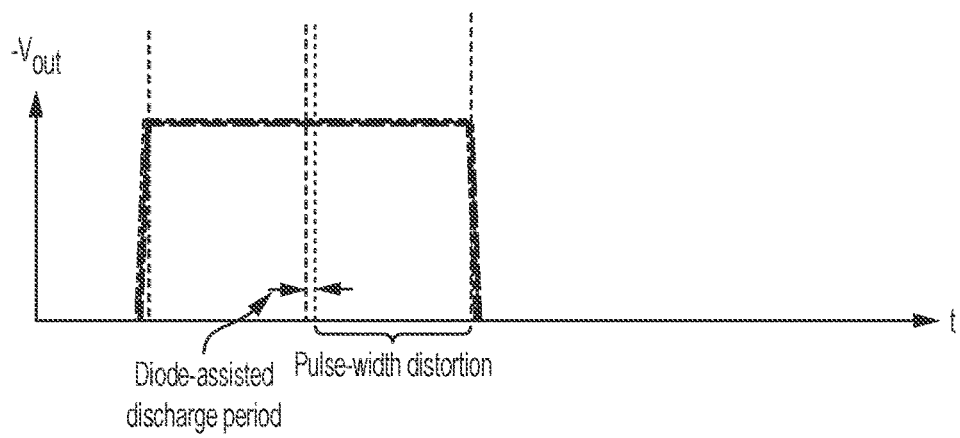

The effect of the diode 204 in conjunction with the buffer amplifier 202 on the input voltage $V_{in}$ and the output voltage $V_{out}$ and the concomitant pulse-width is schematically shown in FIG. 3, wherein FIG. 3A shows three different exemplary input current levels $I_{in\_1}$, $I_{in\_2}$ and $I_{in\_3}$ with $I_{in\_1}>I_{in\_2}>I_{in\_3}$. The photocurrent pulses $I_{in\_1}$, $I_{in\_2}$ and $I_{in\_3}$ produce corresponding voltages $V_{in\_1}$, $V_{in\_2}$ and $V_{in\_3}$ at the input of the TIA, with $V_{in}$ depending on input current $I_{in}$ as $V_{in}=V_{ctrl}+0.7\ V+R_{diode,int}*I_{in}$, wherein $V_{ctrl}$ is the control voltage applied to buffer amplifier 202, 0.7 V is the turn-on voltage of a Si diode and $R_{diode,int}$ is the internal forward resistance of the diode 204. The discharge period assisted by the diode 204 always terminates when the current through the diode 204 becomes negligible, i.e. at $V_{in}=V_{ctrl}+V_{diode}(0)=V_{ctrl}+0.7\ V$. The voltage $V_{ctrl}+V_{diode}(0)$ is in this example selected to be higher by $\Delta V\sim450$ mV than the saturation threshold voltage $V_{sat,th}$ of the TIA, because the diode should be off during normal operation when $V_{in} \leq V_{sat,th}$, i.e. the forward leakage current through the diode should be negligible for the particular application. When the input voltage $V_{in}$ drops below $V_{ctrl}+V_{diode}(0)$, the input current can from this point on only be discharged through the feedback resistor $R_f$. However, the discharge through $R_f$ always starts from $V_{ctrl}+V_{diode}(0)$ regardless of $I_{in}$ which implies that the pulse-widening will be the same for all illustrated currents $I_{in\_1}$, $I_{in\_2}$ and $I_{in\_3}$ that cause the voltages $V_{in\_1}$, $V_{in\_2}$ and $V_{in\_3}$ to exceed $V_{ctrl}+V_{diode}(0)$.

$V_{CC,APD}$ indicates the (positive) supply voltage of the APD. $V_{CC}$ indicates the supply voltage of the ESD in FIG. 11 and (not shown explicitly) of the buffer amplifiers and the TIA. $V_{CC,APD}$ is typically larger than $V_{CC}$.

A comparison of FIG. 3 and FIG. 1 shows the benefits of discharging large currents through the diode 204 which reduces the pulse-width distortion. The discharge time required to reduce $\Delta V=V_{ctrl}+V_{diode}(0)-V_{sat,th}$ to approximately zero is the main contributor of the pulse-width distortion. It is desirable to make $\Delta V$ as small as possible. Although pulse-width distortion could theoretically be reduced by making $\Delta V$ smaller, current leakage through diode 204 could adversely affect normal operation of the TIA, i.e. when $V_{ctrl}$ is selected such that $V_{ctrl}+V_{diode}(O)$ is at most only slightly above $V_{sat,th}$ (for example by no more than the turn-on voltage of the diode, preferably by no more than half the turn-on voltage of the diode, or by a multiple of the thermal voltage $V_T$ of the Si diode, for example $8*V_T=200$ mV, as long as $V_{in}$ is still within the normal operating range of the TIA).

Although pulse-width distortion is reduced from FIG. 1 with diode-assisted clipping illustrated by the results in FIG. 3, the time constant of the discharge of $\Delta V$ through $R_f$ can be on the order of tens of nanoseconds which can still be unacceptably long for some applications. The pulse-width distortion can be further reduced with adaptive clipping which will now be described.

Figure 4:
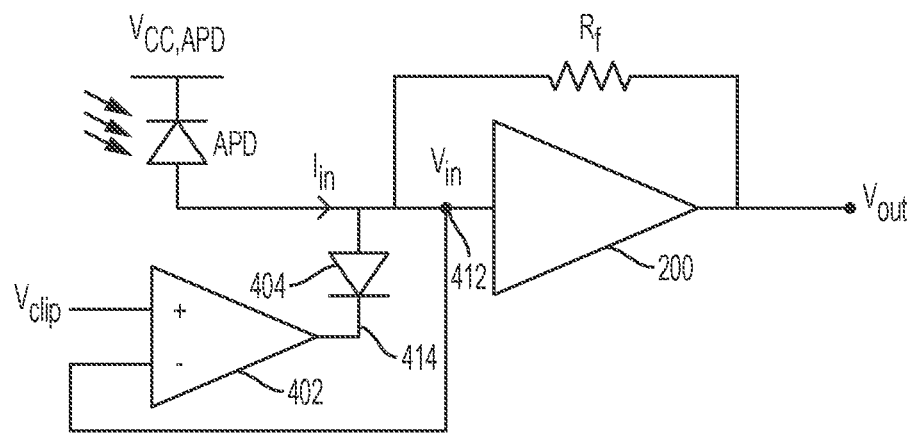
FIG. 4 shows a first embodiment of a schematic circuit diagram for adaptive clipping controlled by an external clip voltage, according to some embodiments of the disclosure.

According to some embodiments of the disclosure, illustrated in FIG. 4, the input voltage $V_{in}$ may be clipped adaptively by adjusting the voltage across a diode 404 commensurate with an externally applied clip voltage $V_{clip}$. The adaptive clipping circuit of FIG. 4 differs from the circuit previously described with reference to FIG. 2 in that the inverting input of amplifier 402 is not tied to a fixed potential as in FIG. 2, such as a common mode voltage or to ground, but instead receives the voltage $V_{in}$ from the input of the TIA.

The adaptive clipping circuit of FIG. 4 operates as follows: the output voltage of op-amp 402 is linearly proportional to the voltage difference between the positive input terminal (+) and the negative input terminal (−) by a gain factor. An ideal op-amp has infinite gain, infinite input resistance, and zero output resistance. A consequence of the assumption of infinite gain is that, when the output voltage is within the linear region of the op-amp, the voltage at the positive input terminal (+) is always equal to the voltage at the negative input terminal (−). Without the diode 404, the circuit of FIG. 4 would be a voltage follower, in which the feedback loop formed by the amplifier 402 and the diode 404 always drives noise 412 such that $V_{in}=V_{clip}$. When the diode 404 having a forward voltage $V_f$ is inserted between the output of op-amp 402 and the negative input terminal (−) and when a clip voltage $V_{clip}$ applied to the positive input terminal (+), the feedback loop formed by the amplifier 402 and the diode 404 is unable to equalize $V_{in}$ to $V_{clip}$ when $V_{in}<V_{clip}$. For example, as described above, when $V_{in}$ 2V and $V_{clip}$ 2.2 V, the feedback loop has no effect, TIA is operating in linear region, and $V_{in}$ is determined by the output common mode voltage of the amplifier 200 plus the input current $I_{in}$ times $R_f$.

During a high current pulse, $V_{in}$ is charged up to $V_{clip}$, at which point, the feedback loop formed by the amplifier 402 and the diode 404 is activated and modulates the cathode of diode 404 such that the current flowing through diode 404 prevents $V_{in}$ from increasing further to keep it from going above the desired clip voltage $V_{clip}$. With the exemplary adaptive clipping circuit of FIG. 4, $\Delta V=V_{clip}-V_{sat,th}$ can be set to a value smaller than the actual, temperature-dependent soft turn-on voltage of the diode 404, without causing a high leakage current through diode 404 during normal operation, resulting in very small pulse-width distortion and a shorter time to return to normal operation. This was not possible with the diode circuit of FIG. 2 because a small value of $\Delta V=V_{ctrl}+V_{diode}(0)-V_{sat,th}$ would cause a large voltage drop across the diode 204 and a commensurate large leakage current during normal operation.

Figure 5:
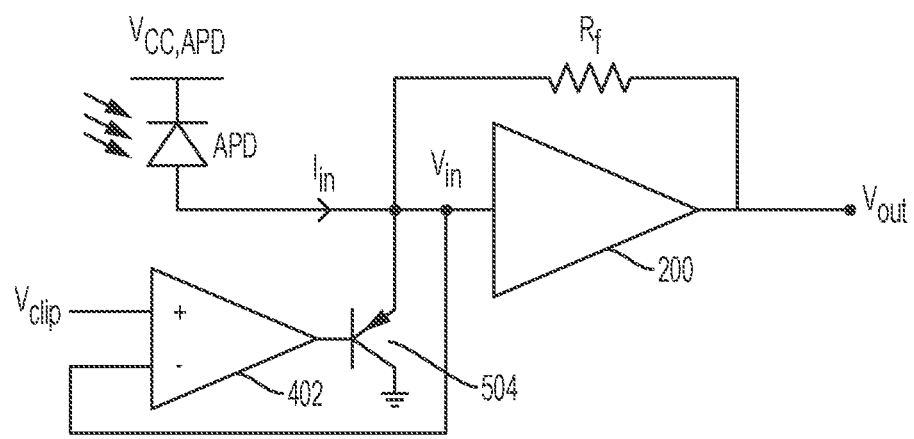
FIG. 5 shows a second embodiment of a schematic circuit diagram for adaptive clipping controlled by an external clip voltage, according to some embodiments of the disclosure.

According to some embodiments of the disclosure, as illustrated in FIG. 5, the functionality provided by the diode 404, i.e. preventing the feedback loop from increasing $V_{in}$, can also be provided by a transistor 504, for example an open-emitter PNP emitter follower or an open-source PMOS (p-type metal-oxide-semiconductor field-effect transistor) source follower, because both of these open-emitter/open-source stages can sink current and discharge/reduce $V_{in}$, but are unable to source current to charge/increase $V_{in}$. The feedback loop pulls the voltage down when $V_{in}$ exceeds, for example, the exemplary value of 2.2 V. As mentioned above, the adaptive clipping circuits shown in FIGS. 4 and 5 should be sized appropriately to handle large currents; however, the size-related capacitance limits the response time. Stated differently, the loop bandwidth of the adaptive clipping circuit has to be sufficiently high so that the loop can respond quickly to the rising edge of the input current pulse and prevent $V_{in}$ from reaching hazardous levels. However, since the loop is off during normal operation, the loop has to be established first (wake up phase) and can only thereafter respond by lowering $V_{in}$ to the desired level close to $V_{sat,th}$.

Another problem with achieving higher "maximum tolerable currents" is that higher amplitude current pulses charge $V_{in}$ to $V_{sat,th}$ faster, thus requiring faster response times.

Figure 6A:
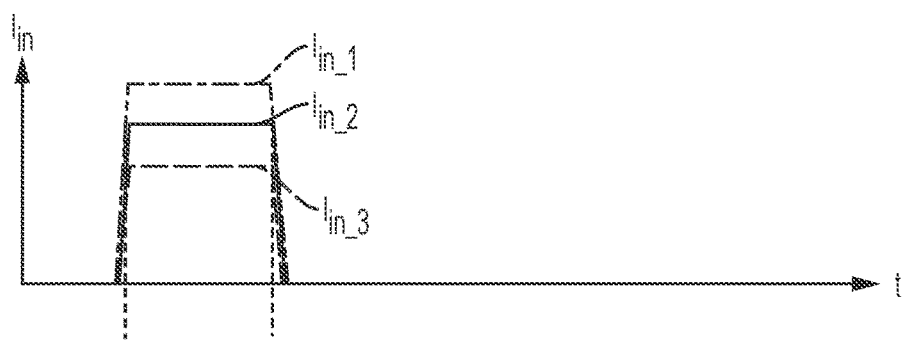
FIGS. 6A-C show the effect of clipping and adaptive clipping of the input voltage of a TIA with the adaptive clipping circuits of FIGS. 4 and 6, according to some embodiments of the disclosure.
Figure 6B:
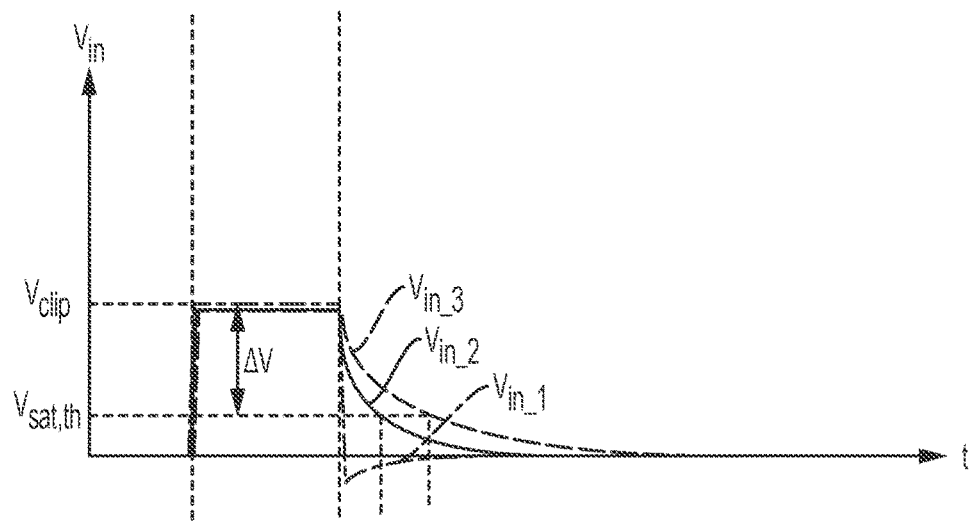
Figure 6C:
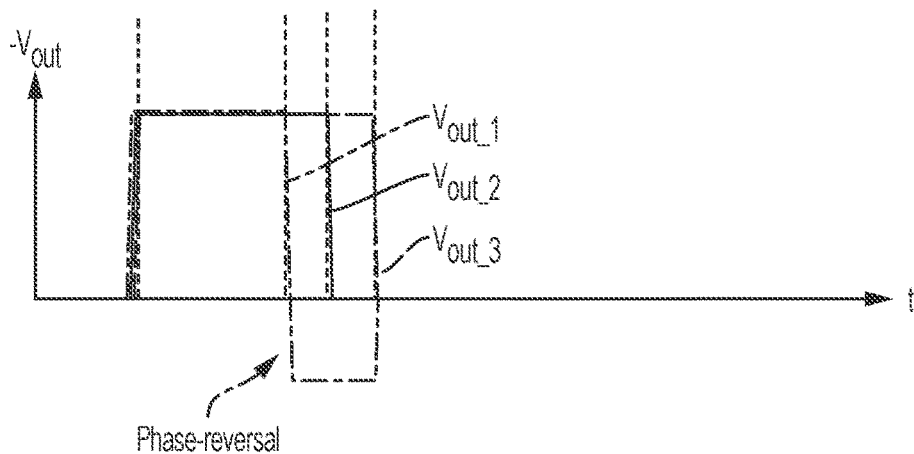

FIGS. 6A-6C illustrate schematically the effect of different, in particularly very high input current levels $I_{in\_1}$, $I_{in\_2}$, $I_{in\_3}$ on the shape of the input voltages $V_{in\_1}$, $V_{in\_2}$, $V_{in\_3}$ at the input of the TIA and the output voltages $V_{out\_1}$, $V_{out\_2}$, $V_{out\_3}$ generated by the TIA. As discussed above, adaptive clipping limits the voltage $V_{in}$ to $V_{clip}$ close to the saturation threshold $V_{sat,th}$ independent of the input current $I_{in}$. Since the voltage at which $V_{in}$ is clipped is close to the saturation threshold $V_{sat,th}$, the remaining excess voltage $\Delta V=V_{clip}-V_{sat,th}$ is discharged through $R_f$ with a time constant $\tau=R_f*C$. The pulse-width of the output pulse from the TIA can thus be reduced with adaptive clipping to close to the width of the input current for not excessively high input currents, such as exemplary input current $I_{in\_3}$ in FIG. 6A.

However, the dynamic response of the clipping circuits of FIGS. 4 and 5 at elevated input current levels, such as input currents $I_{in\_1}$ and $I_{in\_2}$ in FIG. 6A can result in pulse distortion which manifests itself in the narrowing of $V_{in\_2}$ compared to $V_{in\_3}$ in FIG. 6B and the phase reversal of $V_{in\_1}$ in FIG. 6B, creating a negative voltage glitch at $V_{in\_1}$ at the falling edge of the current pulse Iin_1. If the negative voltage glitch is strong enough, $V_{in\_1}$ may decrease below the common mode voltage and produce at the output of the TIA a pulse with opposite-polarity, as illustrated in FIG. 6C.

According to some embodiments of the disclosure, as illustrated in FIG. 7, adaptive clipping may be combined with diode clipping, hereinafter referred to as assisted adaptive clipping. Assisted adaptive clipping adds a faster alternative current path to the adaptive clipping circuit so that the loop can respond quickly to the rising edge of the input current pulse and prevent $V_{in}$ from reaching undesirable or hazardous levels.

With assisted adaptive clipping the overall clipping circuit is comprises a first diode clipping path 701 in accordance with FIG. 2 that responds first and clips $V_{in}$ at a relatively safe voltage with is somewhat higher than $V_{clip}$ and is controlled by the control voltage $V_{ctrl}$, because diode clipping has a shorter response time determined solely by the transit time of the diode in the first diode clipping path 701.

Figure 7A:
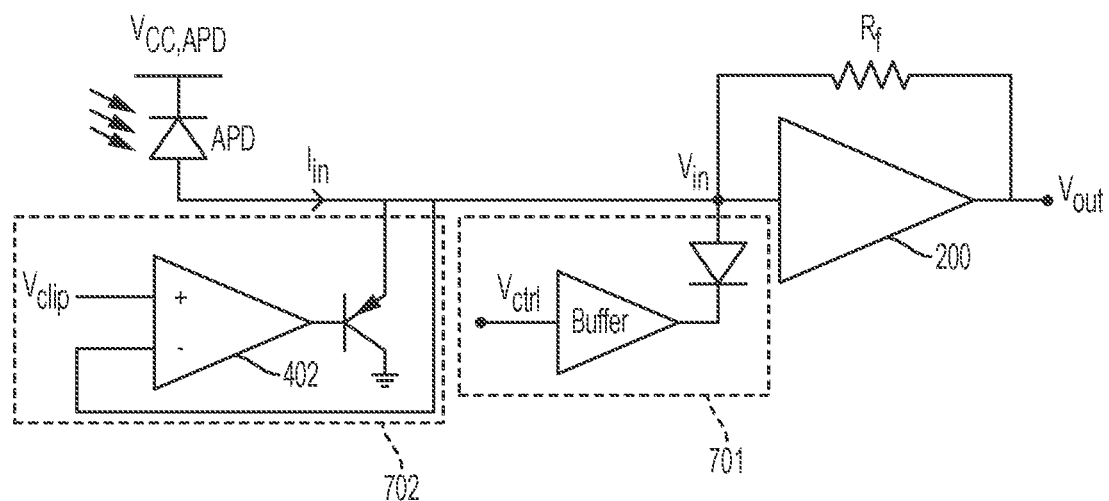
FIG. 7A shows a combination of the clipping circuit of FIG. 2 and the adaptive clipping circuit of FIG. 5, according to some embodiments of the disclosure.
Figure 7B:
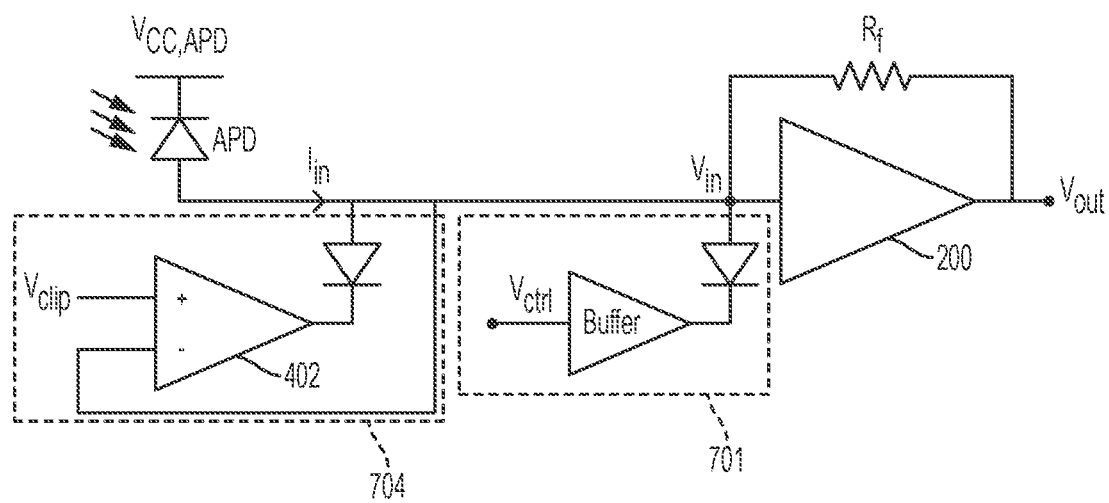
FIG. 7B shows a combination of the clipping circuit of FIG. 2 and the adaptive clipping circuit of FIG. 4, according to some embodiments of the disclosure.

Thereafter, the adaptive clipping feedback loop 702 illustrated in FIG. 7A and designed in accordance with FIG. 5 and the adaptive clipping feedback loop 704 illustrated in FIG. 7B and designed in accordance with FIG. 4, respectively, wake up and begins to dissipate the current because it clips at a lower voltage than the non-adaptive clipping circuit, as mentioned above. In other words, the non-adaptive first diode clipping path 701 responds first and dissipates the first surge of a high input current. Thereafter, the adaptive clipping feedback loop 702 or 704, respectively, wakes-up, and starts dissipating also the current passing through non-adaptive clipping circuit, thereby further reducing the input voltage (because the adaptive clipping feedback loop 702, 704 clips at a lower voltage value above $V_{sat,th}$). During this transition period, the current through the adaptive clipping feedback loop 702, 704 increases, whereas the current through non-adaptive clipping path 701 decreases. $V_{in}$ is thus discharged via the respective adaptive clipping feedback loops 702 and 704 down to approximately $V_{clip}$.

Since very high currents are handled initially, i.e. before the adaptive clipping feedback loop 702, 704 is activated, by diode clipping with the first diode clipping path 701, the devices of the adaptive clipping feedback loops 702, 704 can be made smaller, thus increasing the bandwidth of the feedback loop.

Figure 8A:
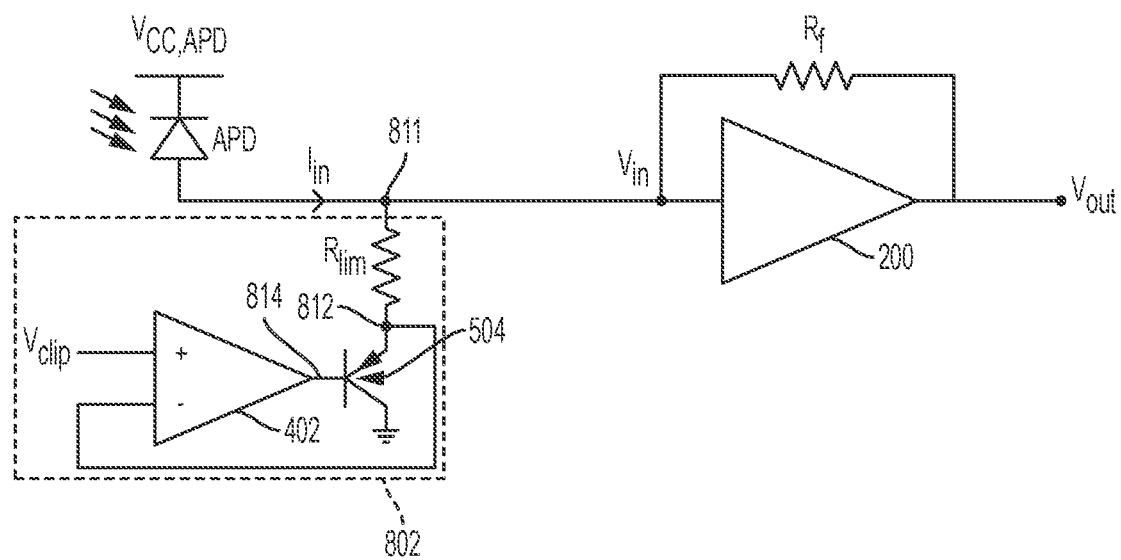
FIG. 8A shows a combination of the adaptive clipping circuit of FIG. 5 with an additional current-limiting resistor, according to some embodiments of the disclosure.
Figure 8B:
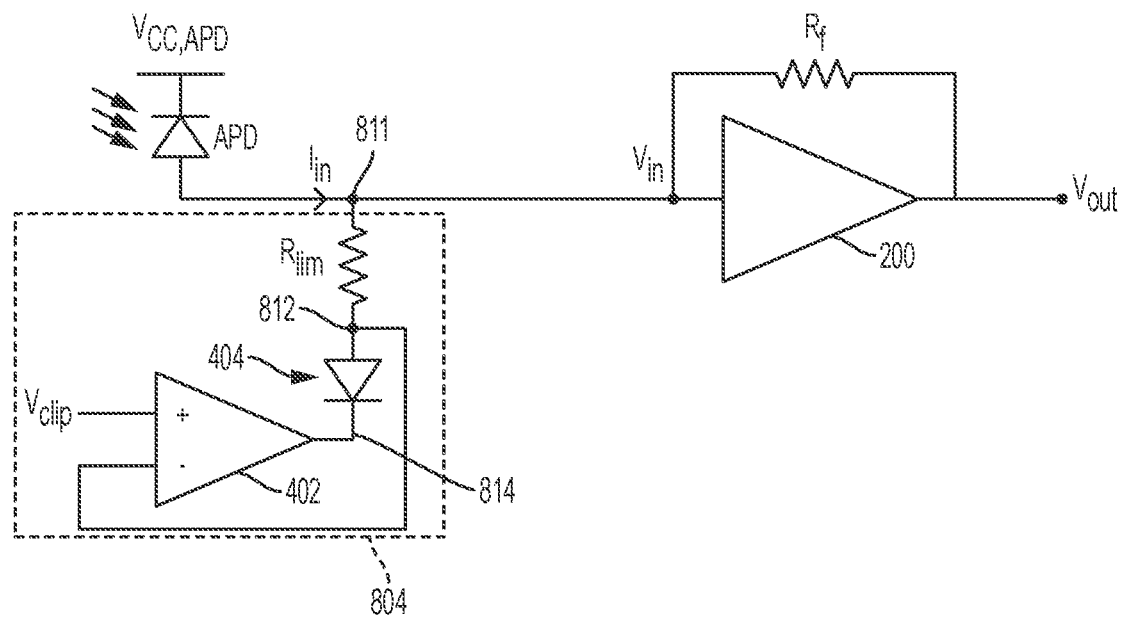
FIG. 8B shows a combination of the adaptive clipping circuit of FIG. 4 with an additional current-limiting resistor, according to some embodiments of the disclosure.

According to some embodiments of the disclosure adaptive clipping may be made more robust by limiting the adaptive clipping current flowing through the transistor 504 in circuit 802 of FIG. 8A or similarly through the diode 404 in circuit 804 of FIG. 8B. To this end, a current-limiting resistor $R_{lim}$ may be inserted between the input terminal of the TIA 200 and the open-emitter PNP emitter follower or open-source PMOS source follower 504 (at 812) in adaptive clipping circuit 802 shown in FIG. 8A or commensurately between the input terminal of the TIA 200 and the anode (at 812) of the diode in adaptive clipping circuit 804 shown in FIG. 8B. Due to the voltage drop across the resistor $R_{lim}$, the current dissipated by the PNP emitter follower or open-source PMOS source in the adaptive clipping circuit 802 or by the diode in the adaptive clipping circuit 804, respectively, is reduced.

The feedback loop in adaptive clipping circuit 804 between node 812 and the (−) input of amplifier 402 holds the node 812 at the clip voltage $V_{clip}$, allowing $V_{in}$ to initially have a higher voltage $V_{in}=V_{clip}+R_{lim}*I_{diode}$ when the diode is forward-biased, i.e. when $V_{in}>V_{clip}$. The adaptive clipping circuit 804 has no effect when $V_{in}<V_{clip}$ since diode 404 is then reverse-biased and blocks current flow. The adaptive clipping circuit 802 operates in the same manner. While $V_{in}$ is at a higher voltage than $V_{clip}$ by $R_{lim}*I_{diode}$ during the initial discharge period of the adaptive clipping circuit 804, $V_{in}$ approaches $V_{clip}$ when $I_{diode}$ goes to zero, concluding the discharge through the adaptive clipping circuit 804. The resistor $R_{lim}$ operates to create an offset between the voltage at node 812 and $V_{in}$. This offset provides a means to charge the node 812 (temporarily pulling up the voltage) and, therefore, gives the feedback loop the ability to hold node 812 at $V_{clip}$ during the discharge through $R_{lim}$.

Figure 9A:
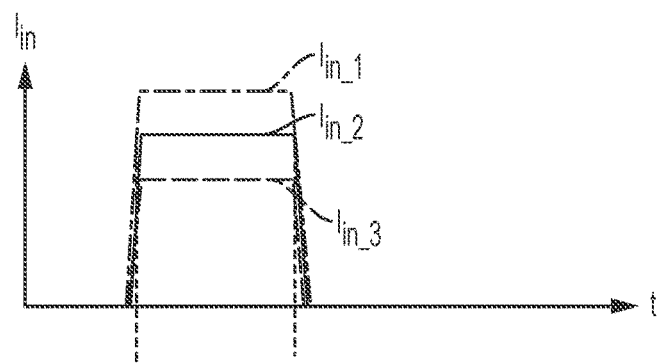
FIGS. 9A-9C show the effect of adaptive clipping of the input voltage of a TIA with the adaptive clipping circuit of FIG. 8B with a limiting resistor, according to some embodiments of the disclosure.
Figure 9B:
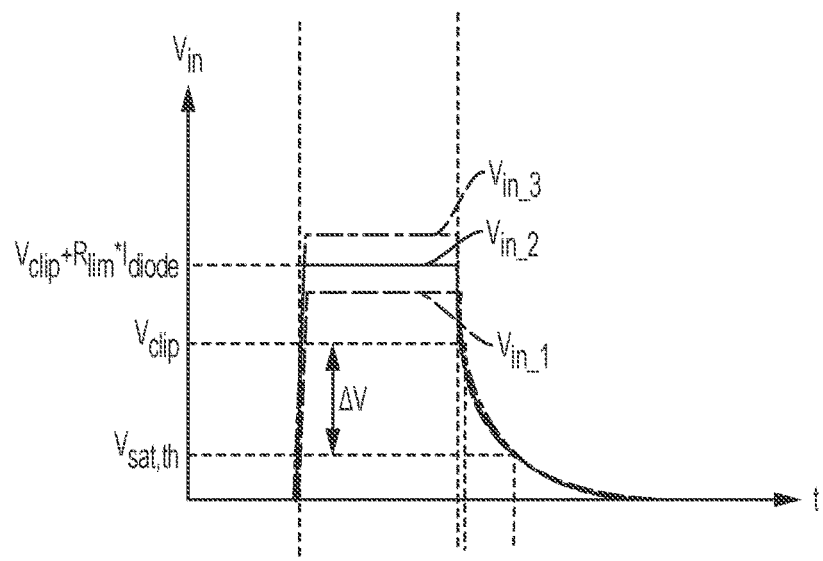
Figure 9C:
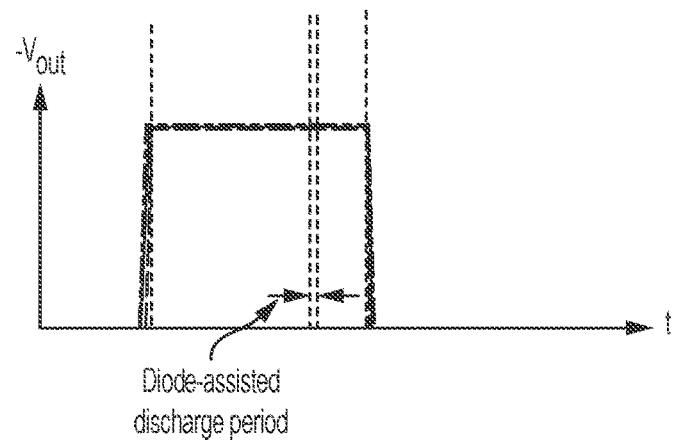

The operation of the exemplary adaptive clipping circuit 804 is illustrated schematically in FIG. 9. The feedback loop of the adaptive clipping circuit 804 holds the voltage at node 812 at $V_{clip}$, regardless of the input current $I_{in}$ while $V_{in}$ voltages are $R_{lim}*I_{diode}$ above $V_{clip}$ (FIG. 9A shows three different input current levels $I_{in\_1}>I_{in\_2}>I_{in\_3}$). When the amplitude of the input current pulse returns to zero, i.e. at the end of the input pulse, diode 404 continues to conduct current assisting $V_{in}$ to be discharged. This assist continues until the current through diode 404 decreases to zero at which point the voltage drop on $R_{lim}$ equals zero. As a result, the diode assist phase always finishes at voltage $V_{clip}$. Once the excess current has been dissipated through the adaptive clipping circuit 804 via the diode 404 and the current-limiting resistor $R_{lim}$, the remaining current is dissipated through the feedback resistor $R_f$ of the TIA 200. It should be emphasized that because the voltage at node 814 is pulled down below $V_{clip}$ commensurate with the forward voltage drop across the diode 404, the voltage difference $\Delta V$ between $V_{clip}$ and $V_{sat,th}$ can be held to values of, for example, less than 0.3-0.4 V, for example 0.1 V, which is much lower than the forward voltage of a typical Si diode 404 of 0.7 V.

The above discussion applies, mutatis mutandis, also to the adaptive clipping circuit 802. In some embodiments, while not shown in FIG. 8, the circuits can further include assisted adaptive clipping, e.g., where the circuit includes a first diode clipping path 701 illustrated by FIG. 7.

In the examples illustrated in FIG. 8, $R_f\sim5$-$10$ k$\Omega$ and $R_{lim}\sim20\Omega$, so that the time constant for the discharge through $R_{lim}$ to the voltage $V_{clip}$ can be much faster than the remaining discharge through the feedback loop of the TIA.

Without a current-limiting resistor $R_{lim}$ the voltage between the nodes 811 and 812 will actually reverse polarity above a certain input current level (see FIG. 6B), meaning that $V_{in}$ will drop below $V_{clip}$ since the feedback loop cannot act instantaneously. When $V_{in}<V_{clip}$, $V_{clip}$ cannot pull-up the node 811 to $V_{clip}$ because the diode 404 (or commensurately the transistor 504) are reverse-biased. This situation leads to the phase reversal described above. The current-limiting resistor $R_{lim}$ creates an offset between the node 812 sensed by the feedback and $V_{in}$. This offset provides a means to charge the node 812 (a temporary pull-up path) and, therefore, gives the feedback loop the ability to hold the node 812 at $V_{clip}$ during the discharge.

Figure 10:
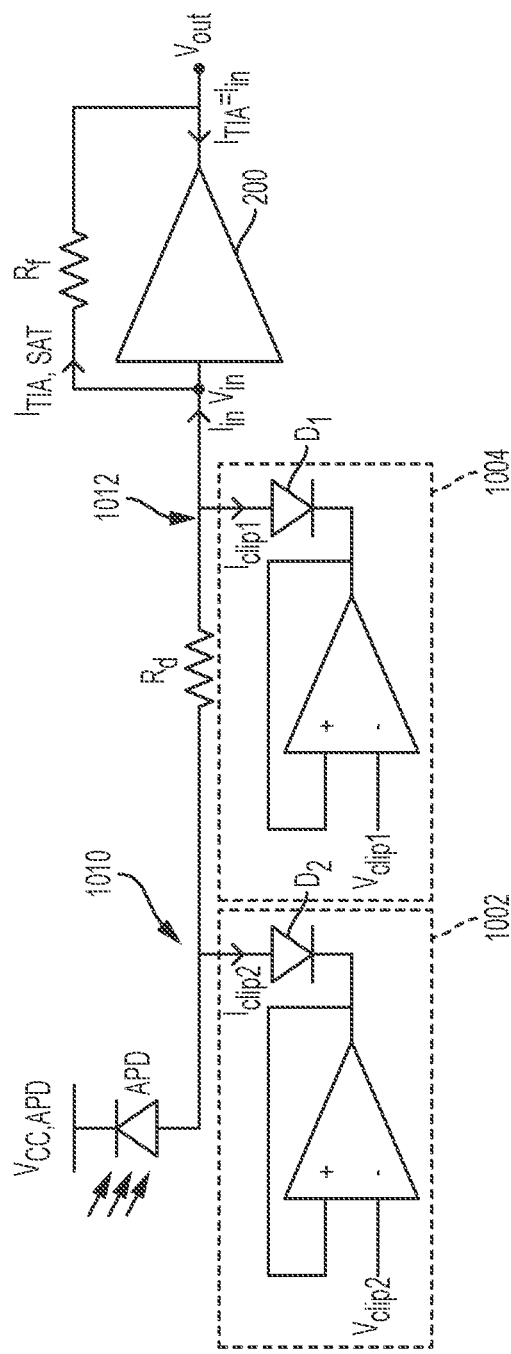
FIG. 10 shows a third embodiment of a schematic circuit diagram for adaptive clipping with a current-limiting resistive element and two clipping circuits.

According to some embodiments of the disclosure illustrated in FIG. 10, a resistive element $R_d$ may be inserted in the current path between the anode of the APD and the input of the TIA 200. In the embodiment of FIG. 10, a first clipping circuit 1004 may be connected to a connection point 1012 between the input of TIA 200 and a first terminal of the resistor $R_d$, and a second clipping circuit 1002 may be connected to a connection point 1010 between the anode of the APD and a second terminal of the resistor $R_d$. The second clipping circuit 1002 is designed to handle larger current pulses with less capacitive loading at the input of TIA 200. In this structure, the purpose of the first clipping stage 1004 is to keep $V_{in}$ at a desirable voltage level such that TIA can operate properly, i.e. as close as possible to the saturation threshold voltage of the TIA. The maximum current that is handled by the first clipping circuit 1004 is limited by the resistor $R_d$. Although the voltage drop caused by the internal resistance of the diode $D_1$ of the first clipping circuit 1004 is still of concern, as previously discussed in conjunction with FIG. 2, the maximum current supplied by the first clipping circuit 1004 is limited by the resistor $R_d$ and by the second clipping circuit 1002. With these relaxed current handling requirements, the diode $D_1$ can now have a much smaller size, since its internal resistance will be less of a concern due to the smaller currents flowing through the diode $D_1$.

The current through diode $D_1$ will generate a voltage drop across the resistor $R_d$. Because of this voltage drop, assuming that for example $V_{clip2}$ is selected to be equal to $V_{clip1}$, the voltage applied to diode $D_2$ will be larger than the voltage applied to diode $D_1$. Therefore, the current through diode $D_2$ is larger than the current through diode $D_1$ even when the two diodes $D_1$ and $D_2$ are equally sized. As a result, a smaller portion of the current from APD is handled by the first clipping circuit 1004 while the larger remaining current from the APD is handled by the second clipping circuit 1002.

Although the clipping circuits 1002 and 1004 are each shown as having a structure substantially identical to the circuit having the buffer 202 and the diode 204 shown in FIG. 2, or likewise the circuit 701 of FIG. 7, it will be understood that one of the clipping circuits 1002 and 1004 may also have the structure of circuits 702 and 704 (FIG. 7) or of circuits 802 and 804 (FIG. 8), respectively.

The second clipping circuit 1002 deals with a substantial fraction of the high input current from the APD. However, the voltage-dependent internal resistance $R_{D2,int}$ of the diode $D_2$ of the second clipping circuit 1002 is not really of concern, because the output voltage $V_{APD}$ of the APD does no longer affect the operating point of the TIA. For example, even when the output voltage $V_{APD}$ is very high, for example 5V, the voltage drop across $R_d$ is large enough so that the first clipping circuit 1004 need to deal with only a small portion of the current and is capable of keeping $V_{in}$ close to or only slightly above $V_{clip1}$+0.7V which is within the operating range of the TIA, i.e. as close as possible to the saturation threshold voltage of the TIA. With this architecture, $D_1$ and $D_2$ can be small while still being able to handle large input currents.

At a high current where both clipping circuits 1002 and 1004 are activated, the current $I_{clip1,max}$ of the first clipping circuit 1004 can be calculated as;

$$I_{clip1,max}=(V_{clip2}-V_{clip1}+I_{clip2}*R_{D2,int})/(R_d+R_{D1,int}),$$

assuming that the current through feedback resistor $R_f$ is negligible. $R_{D1,int}$ is the voltage-dependent internal resistance of the diode $D_1$, $R_{D2,int}$ is the voltage-dependent internal resistance of the diode $D_2$. The maximum current through $D_1$ would be minimized by selecting $V_{clip2}=V_{clip1}$.

Figure 12:
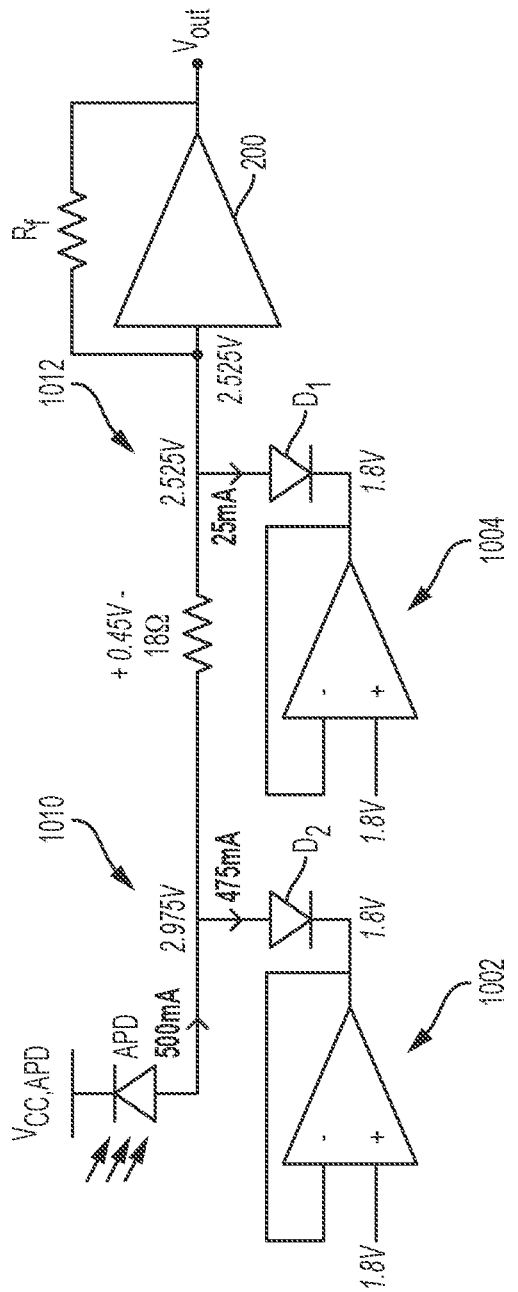
FIG. 12 shows the adaptive clipping circuit of FIG. 10 with exemplary operating parameters.

FIG. 12 shows an example scenario of operating conditions for the circuit of FIG. 10. As mentioned above, $V_{clip1}$ and $V_{clip2}$ may advantageously be chosen to be identical and, for example, equal to 1.8V. Assuming that the APD supplies a photocurrent of 500 mA, that the internal resistances of both diodes $D_1$ and $D_2$ is 1Ω at their respective operating points, and that the resistance of the resistive element $R_d$ is selected to be 18Ω, the current dissipated by the first clipping stage 1004 will be 25 mA and the current dissipated by the second clipping stage 1002 will be 475 mA. The voltage at the connection point 1010 is then 2.975V, while the voltage at the connection point 1012 and thus also at the input of the TIA is 2.525V, which is well within the normal operating range of the TIA. Increasing $R_d$ relaxes the current handling requirement of the first clipping circuit 1004, but increases the noise of the system.

While the illustrated example may not correspond to actual optimized operating conditions, it demonstrates that it operates much better than having only a single stage clipping circuit.

Figure 11:
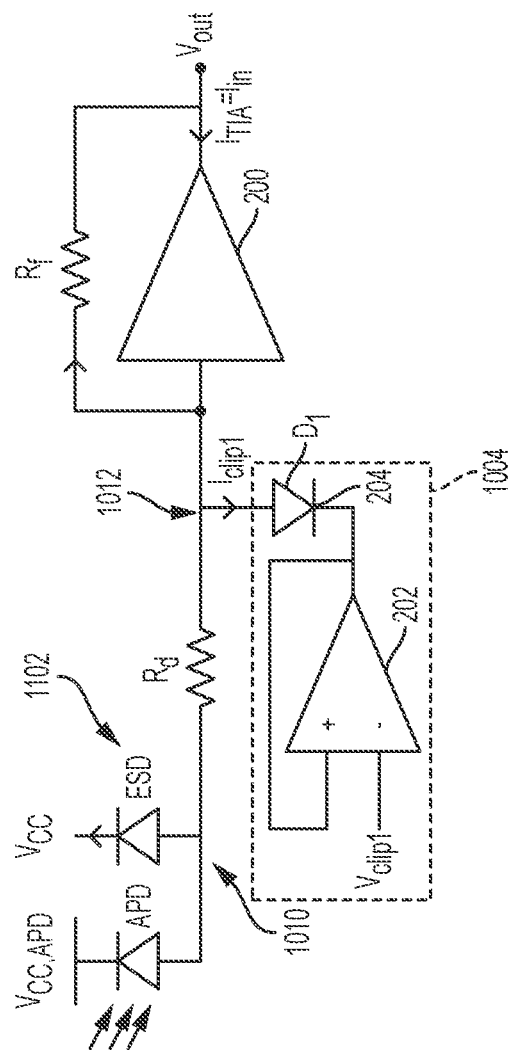
FIG. 11 shows a fourth embodiment of a schematic circuit diagram for adaptive clipping with a current-limiting resistive element and an electrostatic current discharge diode (ESD)

According to some embodiments of the disclosure illustrated in FIG. 11, the first clipping stage 1002 of FIG. 10 may be replaced with an ESD (electrostatic discharge) diode 1102 which is typically already incorporated in a photocurrent detection circuit to provide ESD protection and is connected in parallel with the APD. This circuit is equivalent to the circuit of FIG. 10, where $V_{clip2}=V_{CC}<V_{CC,APD}$, and where there is no need for the buffer in 1002. Using ESD diode as the second clipping stage has the advantage that no additional capacitance is introduced at the connection point 1010 since ESD diode is already in place. The disadvantage, however, is that $V_{clip2}$ has to be equal to $V_{CC}$, which results in higher maximum current in first clipping structure. This current can be reduced by increasing $R_d$, however, increasing $R_d$ increases the noise contribution.

Detection of pulse dispersion can provide information about weather conditions in optical ranging applications since multiple scattering occurs for example on water droplets, such as fog. The weather conditions may thus be an important parameter for ranging applications because of a resulting change in the shape of the reflected laser pulse. Aside from detecting weather conditions, dispersion information is also needed to maintain the accuracy of ranging algorithms.

The components used in laser radar electronics are typically low-priced and thus this technology is potentially interesting for high-volume applications.

According to one embodiment, the polarity of the circuits including the polarity of the APD may be reversed, without affecting the performance or operation of the aforedescribed circuits.

Although the embodiments have been described with reference to LIDAR applications, it will be understood that the described and illustrated circuits can be used whenever light pulses with varying intensity need to be detected, for example in optical time domain reflectometers (OTDR) where overloading by large optical pulses can occur. Moreover, the described and illustrated circuits may be used when other type of current pulses need to be detected.

In the drawings, clipping or limitation of the input voltage $V_{in}$ is shown only for one polarity. It is noted that it is possible to provide clipping for two polarities by providing clipping circuits which also clip the other polarity. This can be realized easily by, e.g., the use of Schottky diodes, which conduct current in the forward direction and block current flow in the reverse direction. This is in contrast to, e.g., Zener diodes, which are used in the reverse direction.

It should be noted that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, exemplary embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

It should also be noted that in this Specification, references to various features (e.g., elements, structures, modules, components, steps, operations, characteristics, etc.) included in "one embodiment", "exemplary embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The 'means for' in these instances (above) can include (but is not limited to) using any suitable component discussed herein, along with any suitable software, circuitry, hub, computer code, logic, algorithms, hardware, controller, interface, link, bus, communication pathway, etc.

The invention claimed is:

1. A current-pulse detection system, comprising:
a transimpedance amplifier (TIA), configured to convert an input current applied to an input port of the TIA into an output voltage, where the input current is based on a current generated by a sensor and provided at a signal output of the sensor, and where the input port of the TIA is to be coupled to the signal output of the sensor;
a first clipping circuit, coupled to the input port of the TIA and configured to, in response to a clip voltage applied to the first clipping circuit, limit an input voltage to the TIA,
wherein the first clipping circuit includes a first amplifier that includes:
a first input terminal, coupled to the clip voltage,
a second input terminal, coupled to the input port of the TIA, and
an output terminal, coupled to the input port of the TIA; and
a resistive element between the input port of the TIA and the signal output of the sensor.

2. The current-pulse detection system of claim 1, wherein the second input terminal is coupled to the input port of the TIA by a limiting resistor.

3. The current-pulse detection system of claim 2, wherein the output terminal of the first amplifier is coupled to the input port of the TIA by the limiting resistor.

4. The current-pulse detection system of claim 2, wherein the TIA includes a feedback resistor, and wherein a resistance of the limiting resistor is smaller than a resistance of the feedback resistor.

5. The current-pulse detection system of claim 1, wherein the first clipping circuit is coupled to the input port of the TIA by a rectifying element.

6. The current-pulse detection system of claim 4, wherein the rectifying element includes a diode or a transistor having a gate coupled to the output terminal of the first amplifier and an emitter coupled to the input port of the TIA.

7. The current-pulse detection system of claim 1, further comprising
a second clipping circuit, configured to be coupled to the signal output of the sensor and configured to, in response to a second clip voltage applied to the second clipping circuit, dissipate a portion of the current generated by the sensor.

8. The current-pulse detection system of claim 1, further comprising a diode circuit to be coupled to the signal output of the sensor.

9. The current-pulse detection system of claim 8, wherein the diode circuit comprises an electrostatic discharge protection diode.

10. The current-pulse detection system of claim 1, further comprising
an electrostatic discharge circuit, to be coupled to the signal output of the sensor.

11. The current-pulse detection system of claim 1, wherein the second input terminal of the first amplifier is coupled to the input port of the TIA by the second input terminal being coupled to the output terminal of the first amplifier.

12. The current-pulse detection system of claim 1, wherein the sensor is a photodetector, the photodetector configured to provide the input current in response to an optical signal detected by the photodetector.

13. The current-pulse detection system of claim 1, wherein the current-pulse detection system is a light detection and ranging (LIDAR) system.

14. A current-pulse detection system, comprising:
a transimpedance amplifier (TIA); and
a first clipping circuit, coupled to an input port of the TIA and configured to, in response to a clip voltage applied to the first clipping circuit, limit an input voltage to the TIA,
wherein the first clipping circuit includes a first amplifier that includes:
a first input terminal, coupled to the clip voltage,
a second input terminal, coupled to the input port of the TIA by a limiting resistor, and
an output terminal, coupled to the input port of the TIA.

15. The current-pulse detection system of claim 14, wherein the output terminal of the first amplifier is coupled to the input port of the TIA by the limiting resistor.

16. The current-pulse detection system of claim 14, wherein the TIA includes a feedback resistor, and wherein a resistance of the limiting resistor is smaller than a resistance of the feedback resistor.

17. The current-pulse detection system of claim 14, wherein the current-pulse detection system is a light detection and ranging (LIDAR) system.

18. A current-pulse detection system, comprising:
a transimpedance amplifier (TIA), configured to convert an input current applied to an input port of the TIA into an output voltage, where the input current is based on a current generated by a sensor and provided at a signal output of the sensor, and where the input port of the TIA is to be coupled to the signal output of the sensor;
a first clipping circuit, coupled to the input port of the TIA and configured to, in response to a clip voltage applied to the first clipping circuit, limit an input voltage to the TIA,
wherein the first clipping circuit includes a first amplifier that includes:
a first input terminal, coupled to the clip voltage,
a second input terminal, coupled to the input port of the TIA, and
an output terminal, coupled to the input port of the TIA; and
a second clipping circuit, configured to be coupled to the signal output of the sensor and configured to, in response to a second clip voltage applied to the second clipping circuit, dissipate a portion of the current generated by the sensor.

19. The current-pulse detection system of claim 18, further comprising an electrostatic discharge circuit, to be coupled to the signal output of the sensor.

20. The current-pulse detection system of claim 18, wherein the second input terminal is coupled to the input port of the TIA by a resistor.

21. The current-pulse detection system of claim 18, wherein the current-pulse detection system is a light detection and ranging (LIDAR) system.

22. A current-pulse detection system, comprising:
a transimpedance amplifier (TIA), configured to convert an input current applied to an input port of the TIA into an output voltage, where the input current is based on a current generated by a sensor and provided at a signal output of the sensor, and where the input port of the TIA is to be coupled to the signal output of the sensor;
an electrostatic discharge circuit to be coupled to the signal output of the sensor; and
a first clipping circuit, coupled to the input port of the TIA and configured to, in response to a clip voltage applied to the first clipping circuit, limit an input voltage to the TIA,
wherein the first clipping circuit includes a first amplifier that includes:
a first input terminal, coupled to the clip voltage,
a second input terminal, coupled to the input port of the TIA, and
an output terminal, coupled to the input port of the TIA.

23. The current-pulse detection system of claim 22, wherein the second input terminal is coupled to the input port of the TIA by a resistor.

24. The current-pulse detection system of claim 22, wherein the current-pulse detection system is a light detection and ranging (LIDAR) system.

25. A current-pulse detection system, comprising:
a transimpedance amplifier (TIA);
a first clipping circuit, coupled to an input port of the TIA and configured to, in response to a clip voltage applied to the first clipping circuit, limit an input voltage to the TIA,
wherein the first clipping circuit includes a first amplifier, having:
a first input terminal, coupled to the clip voltage,
a second input terminal, coupled to the input port of the TIA, and
an output terminal, coupled to the input port of the TIA;
a resistive element; and
a second clipping circuit, configured to, in response to a second clip voltage applied to the second clipping circuit, limit the input voltage to the TIA,
wherein:
an output terminal of the second clipping circuit is coupled to a first terminal of the resistive element, and
a second terminal of the resistive element is coupled to the input port of the TIA.

26. The current-pulse detection system of claim 25, wherein:
the second clipping circuit includes a second amplifier,
the output terminal of the second clipping circuit is an output terminal of the second amplifier,
the second amplifier includes a first input terminal coupled to the second clip voltage, and
the second amplifier further includes a second input terminal coupled to the output terminal of the second amplifier.

27. The current-pulse detection system of claim 25, wherein the output terminal of the second clipping circuit is coupled to the first terminal of the resistive element by a rectifying element.

28. The current-pulse detection system of claim 25, wherein the second input terminal is coupled to the input port of the TIA by a resistor.

29. The current-pulse detection system of claim 25, wherein the current-pulse detection system is a light detection and ranging (LIDAR) system.

* * * * *